United States Patent [19]
Akiyama et al.

[11] Patent Number: 5,747,364
[45] Date of Patent: May 5, 1998

[54] METHOD OF MAKING SEMICONDUCTOR WAFERS AND SEMICONDUCTOR WAFERS MADE THEREBY

[75] Inventors: Nobuyuki Akiyama, Hiratsuka; Fumitaka Kai, Miyazaki; Masahiko Maeda, Miyazaki; Hirofumi Hajime, Miyazaki; Naoki Yamada, Miyazaki, all of Japan

[73] Assignee: Komatsu Electronic Metals Co., Ltd., Kanagawa, Japan

[21] Appl. No.: 824,301

[22] Filed: Mar. 26, 1997

[51] Int. Cl.$^6$ ............ H01L 21/322; H01L 21/302
[52] U.S. Cl. ............ 438/14; 438/891; 438/974; 438/476
[58] Field of Search .................. 438/476, 691, 438/974, 14

[56] References Cited

U.S. PATENT DOCUMENTS

| | | | |
|---|---|---|---|
| 4,276,114 | 6/1981 | Takano et al. | 156/645 |
| 5,429,711 | 7/1995 | Watabe et al. | 216/52 |
| 5,447,890 | 9/1995 | Kato et al. | 437/249 |
| 5,516,706 | 5/1996 | Kusakabe | 437/12 |
| 5,679,212 | 10/1997 | Kato et al. | 156/636.1 |

FOREIGN PATENT DOCUMENTS

| | | |
|---|---|---|
| 07079266 A | 3/1995 | Japan . |
| 08236489 A | 9/1996 | Japan . |

*Primary Examiner*—John Niebling
*Assistant Examiner*—Michael S. Lebentritt
*Attorney, Agent, or Firm*—Welsh & Katz, Ltd.

[57] ABSTRACT

A method of making semiconductor wafers can prevent processing strain on peripheral portions of wafers caused by non-wax polishing using a template. This involves mirror chamfering or etching the peripheral portions of the wafers after the non-wax polishing step.

3 Claims, 4 Drawing Sheets

METHOD OF MAKING SEMICONDUCTOR WAFERS AND SEMICONDUCTOR WAFERS MADE THEREBY

BACKGROUND OF THE INVENTION

1. Field of the Invention

The invention relates to a method of making semiconductor wafers, and in particular to a method of making semiconductor wafers involving an non-wax polishing of one side or double sides of each wafer by using a template.

2. Description of the Related Art

Recently, semiconductor wafer quality has been continuously improved in line with developments of integrated circuit manufacture technology. Particularly, in order to improve the yield of the semiconductor wafers, not only necessary to reduce the number of defects on one side or double sides of each of the semiconductor wafers, but also on peripheral portions of the semiconductor wafers. In a method of making semiconductor wafers involving non-wax polishing of the one side or the double sides of each wafer one side by one side by using a template, resulting from impact between a template and the peripheral portions of semiconductor wafers, processing strain including oxidation induced stacking faults (OSFs) will be created, so it is necessary to remove the oxidation induced stacking faults.

SUMMARY OF THE INVENTION

Based on the above, the object of the invention is to provide a method of making semiconductor wafers and semiconductor wafers fabricated thereby, which can resolve the processing strain on peripheral portions of wafers caused by non-wax polishing, and more particularly a method of making semiconductor wafers and semiconductor wafers which can remove oxidation induced stacking faults (OSFs).

For preventing to form the processing strain on peripheral portions of semiconductor wafers, a method of making semiconductor wafers of the present invention comprises: slicing an ingot into wafers; chamfering peripheral portions of each wafer; lapping sliced faces of said wafers in order to flatten the wafers; non-wax polishing one side or double sides of each wafer by using a template one side by one side; mirror chamfering or etching the peripheral portions of each wafer; mirror polishing the one side or the double sides of each wafer; and cleaning the wafers.

Furthermore, a method of making semiconductor wafers may include: slicing an ingot into wafers; chamfering peripheral portions of each wafer; lapping sliced faces of each wafer; non-wax polishing one side or double sides of each wafer by using a template one side by one side; mirror polishing the one side or the double sides of each wafer; mirror chamfering or etching the peripheral portions of each wafer; and cleaning the wafers.

Moreover, a method of making semiconductor wafers may also include: non-wax polishing one side or double sides of each lapped wafer by using a template one side by one side; and mirror polishing one side or double sides of each wafer. In addition, the above mentioned method further includes mirror chamfering or etching the peripheral portion of each wafer before or after the mirror polishing. Then, the number of the oxidation induced stacking faults (OSFs) existing on the peripheral portion of each wafer resulting from oxidation is analyzed.

Moreover, preferably semiconductor wafers are made by above methods for of the present invention wherein the semiconductor wafers have no processing strain on the peripheral portions thereof.

BRIEF DESCRIPTION OF THE DRAWINGS

The objects, characteristics, and advantages will be explained clearly by using preferred embodiments with pertinent drawings as follows.

DETAILED EMBODIMENTS OF THE INVENTION

First, a method of making semiconductor wafers according to an embodiment of the invention will be explained hereinafter.

Figure 1:
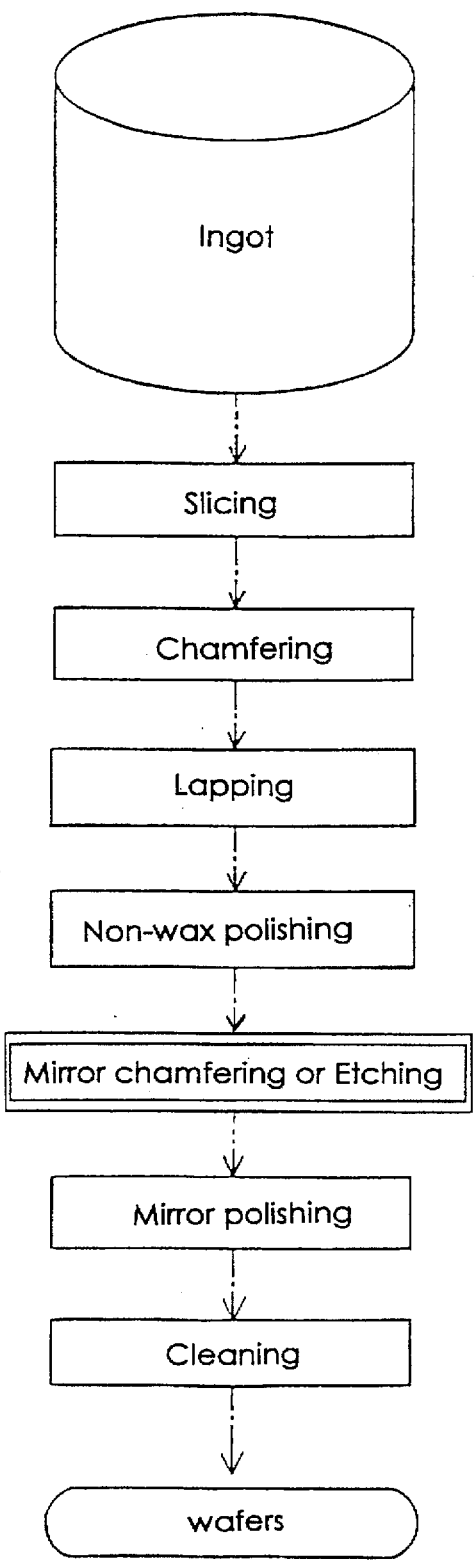
FIG. 1 is a flow chart showing a method of making semiconductor wafers in accordance with the present invention.

Referring to FIG. 1, a method of making semiconductor wafers according to an embodiment includes: slicing an ingot into wafers; chamfering the peripheral portion of each sliced wafer; lapping the sliced faces of each chamfered wafer in order to flatten the wafer; and non-wax polishing one side or double sides of each lapped wafer one side by one side by using a template.

Now, the non-wax polishing process involving use of a template will be explained in the following.

Figure 2:
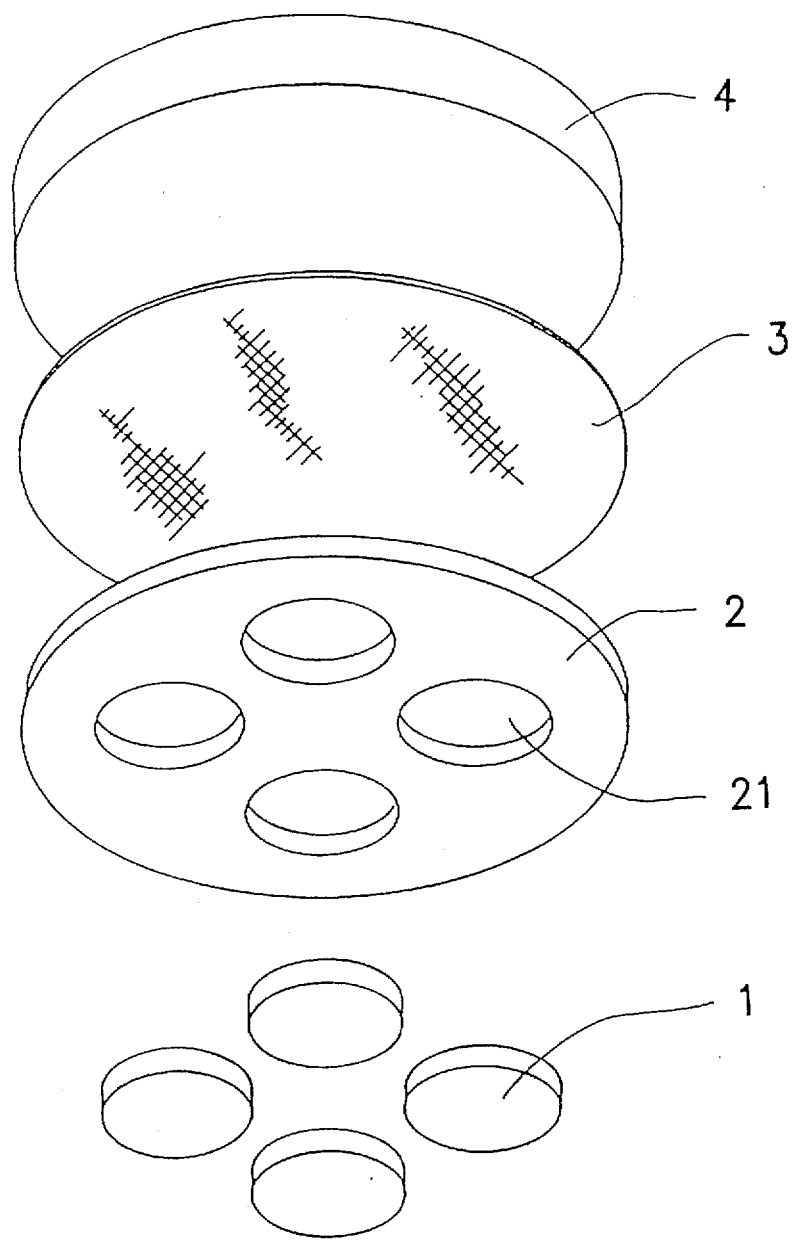
FIG. 2 is a perspective view showing the structure of non-wax polishing process involving use of a template according to the present invention.

Referring to FIG. 2, a pad 3 is stuck on the bottom of a bonding plate 4, and a template 2 is stuck and fixed on the bottom of the pad 3. The template 2 has several supporting holes 21 which are used to hold wafers 1 engaged with each other awaiting the polishing process.

Figure 3:
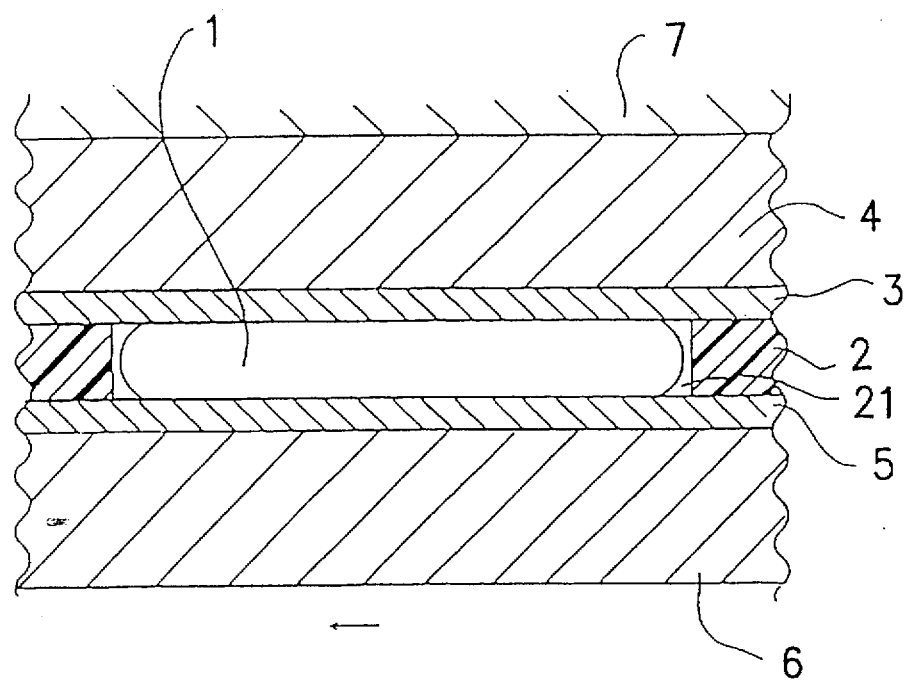
FIG. 3 is a cross-sectional view showing a part of the structure of the non-wax polishing by using a template according to the present invention.

Referring to FIG. 3, the wafers 1 placed in supporting holes 21 is clamped between a pressure plate 7 and a dead plate 6 on which a polishing cloth 5 is fixed. The wafers will be polished by means of rotating the plate 6. During the above-mentioned polishing process, impact between the peripheral portions of wafers and the peripheral portions of the supporting holes 21 on the template 2 will be created, so that processing strain are formed.

Condition of the processing strain can be observed by analyzing the number of the OSFs per unit area.

Figure 4:
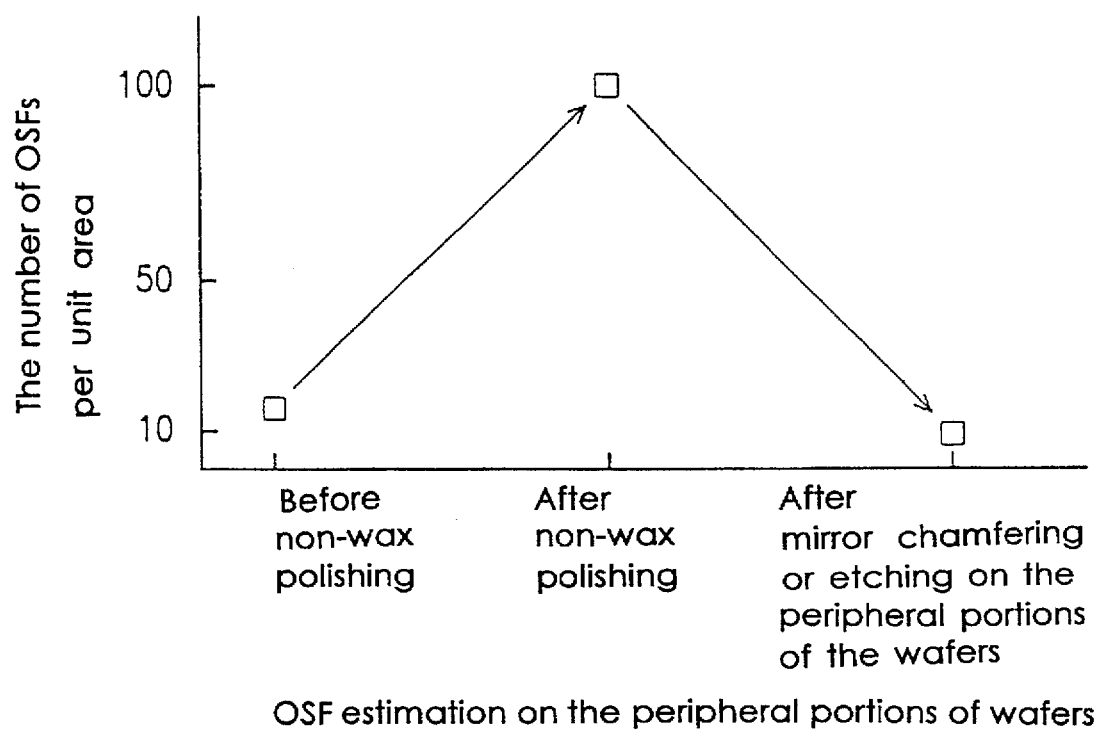
FIG. 4 is a graph showing oxidation induced stacking faults estimation during different processes of semiconductor wafers making.

As shown in FIG. 4, the number of the OSFs before non-wax polishing by using a template is about 10. However, after non-wax polishing by using a template, the number of the OSFs is greatly increased to about 10 times the number of the OSFs before non-wax polishing, i.e., the condition of the OSFs on the peripheral portions of the wafers obviously gets more serious.

To solve the above-mentioned problem, the number of the OSFs is greatly decreased by mirror chamfering or etching on the peripheral portions of the non-wax polished wafers as shown in FIG. 1. Referring to FIG. 4, the condition of the OSFs after mirror chamfering or etching is better than that before the non-wax polishing. Hence, not only the processing strain caused by non-wax polishing can be removed, but also the OSFs existing before non-wax polishing can be significantly reduced.

Next, a mirror polishing is executed on the mirror chamfered or etched wafers. Then, the mirror polished wafers are cleaned up at last.

Moreover, the above-mentioned mirror chamfering or etching executed after the non-wax polishing is not intended to limit the invention. That is, the mirror chamfering or etching can be executed at any step between the non-wax polishing and last cleaning process. Therefor, mirror chamfering or etching the peripheral portions of the wafers right after the mirror polishing can also obtain the same result.

Embodiments of the invention will be described hereafter. For the sake of convenience, the method of analyzing the number of the OSFs is simply described. First, center point of back side of a non-wax polished wafer is supported by a vacuum chuck, then an optical microscope is brought closely to the peripheral portion of the above-mentioned wafer. While rotating the wafer, the numbers of the OSFs per a range of view are visually estimated through the optical microscope respectively and summed to provide the number of the OSFs per unit area.

EMBODIMENT 1

Referring to Table 1, the number of the OSFs estimated during semiconductor wafer making according to the invention is shown wherein the mirror chamfering is executed by buff-polishing using slurry.

TABLE 1

| | Estimated number of OSFs on the peripheral portion of the wafer (/cm$^2$) | | |
|---|---|---|---|
| wafer numbers | Before non-wax polishing | After non-wax polishing | After mirror chamfering |
| 1 | 1258 | 7504 | 699 |
| 2 | 618 | 6018 | 220 |
| 3 | 448 | 5867 | 193 |

As can be learned from Table 1, the number of the OSFs per unit area on the peripheral portions of the wafers after the non-wax polishing process is greatly increased to about 6~13 times that before the non-wax polishing process.

However, the number of the OSFs can be reduced to below one tenth by mirror chamfering the peripheral portion of each wafer. Compared with the number of OSFs before non-wax polishing, we found that the number of the OSFs has been reduced.

Referring to Table 2, the number of the OSFs estimated during semiconductor wafer making according to the invention is shown wherein an etching process is executed.

Furthermore, the component of etching solution is mixed acid solution composed of $HF:HNO_3:CH_3COOH:H_2O$.

TABLE 2

| | Estimated number of OSFs on the peripheral portion of the wafer (/cm$^2$) | | |
|---|---|---|---|
| wafer numbers | Before non-wax polishing | After non-wax polishing | After etching |
| 4 | 856 | 6530 | 432 |
| 5 | 1020 | 7005 | 510 |
| 6 | 650 | 6620 | 206 |

As can be learned from Table 2, in semiconductor wafer making having an etching process, the number of the OSFs per unit area after the non-wax polishing process is greatly increased to about 7~10 times that before the non-wax polishing process. However, the number of the OSFs is reduced to less than one fourteenth after etching the peripheral portion of each wafer. Compared with the number of OSFs before the non-wax polishing process, we found that a reduction of OSFs is attained.

Based on the invention mentioned above, not only can problem of forming the processing strain on the peripheral portion of each wafer non-wax polishing be solved, but also the number of OSFs can be significantly reduced, so that the fabrication yield of semiconductor wafers is raised by using the method according to the invention.

What is claimed is:

1. A method of making semiconductor wafers comprising:

slicing an ingot into a plurality of wafers;

chamfering peripheral portions of said wafers;

lapping sliced faces of said wafers in order to flatten said wafers;

non-wax polishing one side or double sides of each said wafer by using a template one side by one side;

mirror chamfering or etching on the peripheral portions of said wafers;

mirror polishing the one side or the double sides of each said wafer; and cleaning said wafers.

2. A method of making semiconductor wafers comprising:

slicing an ingot into a plurality of wafers;

chamfering peripheral portions of said wafers;

lapping sliced faces of said wafers in order to flatten said wafers;

non-wax polishing one side or double sides of each said wafer;

mirror polishing the one side or the double sides of each said wafer;

mirror chamfering or etching the peripheral portions of said wafers; and cleaning said wafers.

3. A method of making semiconductor wafers comprising non-wax polishing one side or the double sides of each said wafer, and mirror polishing the one side or the double sides of each said wafer, and wherein mirror chamfering or etching the peripheral portions of said wafers is executed before or after said mirror polishing and the number of OSFs caused by oxidation on the peripheral portions of said wafers is analyzed after said mirror chamfering or etching.

* * * * *